(12) United States Patent
Sugimachi et al.

(10) Patent No.: US 6,429,587 B1
(45) Date of Patent: Aug. 6, 2002

(54) ELECTROMAGNETIC-WAVE SHIELDING AND LIGHT TRANSMITTING PLATE AND DISPLAY DEVICE

(75) Inventors: Masato Sugimachi; Taichi Kobayashi, both of Tokyo (JP)

(73) Assignee: Bridgestone Corporation, Tokyo (JP)

( * ) Notice: Subject to any disclaimer, the term of this patent is extended or adjusted under 35 U.S.C. 154(b) by 0 days.

(21) Appl. No.: 09/904,657

(22) Filed: Jul. 16, 2001

Related U.S. Application Data

(63) Continuation of application No. PCT/JP00/08475, filed on Nov. 30, 2000.

(30) Foreign Application Priority Data

Dec. 14, 1999  (JP) ........................................... 11-354718

(51) Int. Cl.$^7$ ................................................. H01J 17/49
(52) U.S. Cl. .................. 313/582; 313/112; 174/35 MS; 252/587; 359/885; 359/359
(58) Field of Search ................. 313/582, 479, 313/112, 586, 587; 174/35 MS, 35 R; 252/587; 359/885, 359

(56) References Cited

U.S. PATENT DOCUMENTS

| | | | | |
|---|---|---|---|---|
| 5,804,102 A | * | 9/1998 | Oi et al. ...................... | 252/587 |
| 6,104,530 A | * | 8/2000 | Okamura et al. ............ | 359/359 |
| 6,197,408 B1 | * | 3/2001 | Kanbara et al. ........ | 174/35 MS |
| 6,217,796 B1 | * | 4/2001 | Hasegawa et al. ........... | 257/587 |
| 6,255,778 B1 | * | 7/2001 | Yoshikawa et al. .......... | 313/582 |
| 6,291,585 B1 | * | 9/2001 | Tomari et al. ................. | 525/99 |

FOREIGN PATENT DOCUMENTS

| | | | |
|---|---|---|---|
| EP | 0 810 452 | 12/1997 | ............ G02B/5/20 |
| EP | 0 908 920 | 4/1999 | ............ H01J/17/16 |
| EP | 0 917 174 | 5/1999 | ............ H01J/29/86 |
| JP | 10-156991 | * 6/1998 | ............ B32B/7/02 |
| JP | 10-157023 | * 6/1998 | ........... B32B/27/20 |
| JP | 10-279936 | 10/1998 | ............ C09K/15/32 |
| JP | 11-65461 | 3/1999 | ............. G09F/9/00 |
| JP | 11-249576 | 9/1999 | ............. G09F/9/00 |

OTHER PUBLICATIONS

Partial translation of JP patent No. 11–249576 (Sep. 1999).*
Partial translation of JP patent No. 11–065461 (Mar. 1999).*
Partial translation of JP patent No. 10–279936 (Oct. 1998).*
Partial translation of JP patent No. 10–156991 (Jun. 1998).*
Partial translation of JP patent No. 10–157023 (Jun. 1998).*

* cited by examiner

*Primary Examiner*—Michael H. Day
(74) *Attorney, Agent, or Firm*—Kanesaka & Takeuchi

(57) ABSTRACT

An electromagnetic-wave shielding and light transmitting plate includes a transparent base plate (2), an electromagnetic-wave shielding member such as a conductive mesh (3), an antireflection film (8) as a front most layer, and a near infrared ray blocking film which are laminated and integrated, wherein the near infrared ray blocking film (5) includes a base film and a near infrared ray blocking layer on a surface of the base film, and the near infrared ray blocking layer contains a near infrared ray absorbing agent composed of diimmonium compound and either a 1,2-benzenethiol copper complex compound or copper dimethyldithiocarbamate.

13 Claims, 2 Drawing Sheets

US 6,429,587 B1

ELECTROMAGNETIC-WAVE SHIELDING AND LIGHT TRANSMITTING PLATE AND DISPLAY DEVICE

CROSS REFERENCE TO RELATED APPLICATION

This is a continuation application of PCT/JP00/08475 filed on Nov. 30, 2000.

FIELD OF THE INVENTION

The present invention relates to an electromagnetic-wave shielding and light transmitting plate which has excellent electromagnetic-wave shielding characteristics, near infrared ray blocking property and optical transparency and, more particularly, to an electromagnetic-wave shielding and light transmitting plate suitable for a front filter of a PDP (plasma display panel). Further, the present invention relates to a display device, such as a PDP, having the electromagnetic-wave shielding and light transmitting plate.

BACKGROUND OF THE INVENTION

With the spread of electronic appliances including office automation apparatuses and communication instruments, electromagnetic wave emission from these appliances has come into a problem. That is, adverse effect of electromagnetic wave to the human body is feared and it is also a problem that the electromagnetic wave affects a precision apparatus to cause malfunction.

For this, plates having good electromagnetic-wave shielding function and still having light transparency have developed as front filters for PDPs of the office automation apparatuses and come into commercial use. Such plates are also used as windows of a place where a precision apparatus is installed, such as a hospital or a laboratory in order to protect the precision apparatus from electromagnetic waves from a portable telephone.

A conventional electromagnetic-wave shielding and light transmitting plate typically comprises transparent base plates such as acrylic boards and a conductive mesh member like a wire netting and is formed by interposing the conductive mesh member between the transparent base plates and by assembling them.

An electromagnetic-wave shielding and light transmitting plate, which has improved characteristics and allows easier handling as compared with the conventional one, is disclosed in Japanese patent publication H11-74683A in which a conductive mesh member is interposed between two transparent base plates and integrally bonded together by transparent adhesives.

This electromagnetic-wave shielding and light transmitting plate has good electromagnetic shielding capability and has light transparency so that distinct pictures are displayed. Further, it has the conductive mesh member interposed between the transparent base plates, thereby preventing scattering of fragments of the transparent base panels when damaged.

In order to improve the electromagnetic-wave shielding function in the conventional electromagnetic-wave shielding and light transmitting plate, it is necessary to ground or earth the electromagnetic-wave shielding member, e.g. the conductive mesh member to the PDP body. Accordingly, the electromagnetic-wave shielding member should extend out of the transparent base plates which interpose the shielding member therebetween so that an extended margin of the shielding member is bent toward and grounded at the back of the assembled light transmitting plate or, alternatively, a conductive adhesive tape should be interposed between the two transparent base plates to come in contact with the electromagnetic-wave shielding member. Typically used as a transparent base plate is a glass plate having a thickness of 2–3 mm. Accordingly, when used for a filter for a big screen, such a glass plate should be considerably heavy so that it is not only hard work to laminate the base plates but also difficult to secure such laminating work.

The electromagnetic-wave shielding and light transmitting plate using two transparent base plates has a great thickness and a heavy weight. It is desired to reduce the thickness and weight of the electromagnetic-wave shielding and light transmitting plate.

In order to prevent malfunctions of remote controllers, the electromagnetic-wave shielding and light transmitting plate requires to prevent near infrared ray from transmitting therethrough. Since the brightness of PDPs has been enhanced, the amount of near infrared rays generated from such PDP increases. Therefore, it is required to impart further improved near infrared ray blocking function.

A transparent base plate made of acrylic resin containing copper material has excellent near infrared ray blocking function. However, acrylic resin has a problem about heat resistance, that is, has poor heat resistance and may be easily thermally deformed. Therefore, it is desired to provide an electromagnetic-wave shielding and light transmitting plate with improved near infrared ray blocking function by using glass base plates having excellent heat resistance as transparent base plates. In addition, when using acrylic resin plates as transparent base plates, it is desired to further improve the near infrared ray blocking function.

OBJECT AND SUMMARY OF THE INVENTION

It is a first object of the present invention to solve the aforementioned problems and thus to provide an electromagnetic-wave shielding and light transmitting plate which solves the aforementioned problems, is suitably used for an electromagnetic-wave shield filter for a PDP, is thin and light, has excellent durability, has excellent electromagnetic-wave shielding function and improved near infrared ray blocking function, and still has high transparency in a range of visible light, thereby displaying distinct pictures.

It is a second object of the present invention to provide an electromagnetic-wave shielding and light transmitting plate which facilitates the work for laminating filter components, and which has excellent electromagnetic-wave shielding function and impact resistance (hard to be broken).

It is a third object of the present invention to provide an electromagnetic-wave shielding and light transmitting plate with a near infrared ray blocking film having improved resistance to heat, moisture, and ultraviolet ray.

It is a fourth object of the present invention to provide a display device which has the electromagnetic-wave shielding and light transmitting plate mentioned above.

The electromagnetic-wave shielding and light transmitting plate of the present invention has a transparent base plate, an electromagnetic-wave shielding member, an anti-reflection film as the front-most layer, and a near infrared ray blocking film which are laminated and integrated together. The near infrared ray blocking film has a base film and a near infrared ray blocking layer formed on a surface of the base film. The near infrared ray blocking layer contains a near infrared ray absorbing agent composed of diimmonium compound, and further contains a copper complex having the following formula (A) and/or a copper compound having the following formula (B):

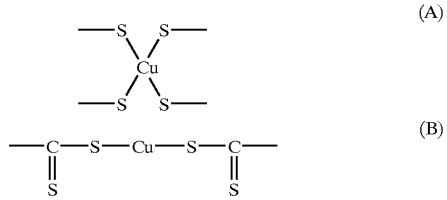

The near infrared ray blocking film to be used in the electromagnetic-wave shielding and light transmitting plate of the present invention contains the diimmonium compound as the near infrared ray absorbing agent in the near infrared ray blocking layer, and contains the aforementioned copper complex and/or the copper compound are employed as the antioxidant agent in the near infrared ray blocking layer, so that the near infrared ray blocking film has significantly improved resistance to heat, moisture, and ultraviolet ray. Therefore, the near infrared ray blocking film keeps its near infrared ray blocking efficiency for a long period of time at a high temperature.

In the base polymer of the near infrared ray blocking layer, the diimmonium compound and the copper complex and/or the copper compound are dispersed. It is preferable that the amount of the diimmonium compound in the near infrared ray blocking layer is 0.01 to 100 parts by weight relative to 100 parts by weight of base polymer and the amount of the copper complex and/or the copper compound in the near infrared ray blocking layer is 0.01 to 100 parts by weight relative to 100 parts by weight of the diimmonium compound.

It is preferable that the base polymer is acrylic resin or polyester resin and the base film is a polyester film.

The antireflection film may be disposed at the front-most side of the electromagnetic-wave shielding and light transmitting plate and the near infrared ray blocking film is disposed at the rear-most side thereof. Both surfaces of the transparent base plate covered by these films improve the durability of the transparent base plate and provide an effect of preventing the transparent base plate from scattering even if broken. Furthermore, work for grounding or earthing the electromagnetic-wave shielding member to the PDP body can be facilitated, thereby ensuring this work without mistake.

It is preferable that the electromagnetic-wave shielding member is a mesh member made of metallic fibers and/or metal-coated organic fibers. Use of this conductive mesh member provides an effect of preventing the scattering of fragments when damaged and thus improving the safety.

In the electromagnetic-wave shielding and light transmitting plate of the present invention, the transparent base plate, the respective films, and the electromagnetic-wave shielding member are bonded and integrated by transparent adhesives. Use of transparent elastic adhesives as the transparent adhesives further ensures the effect of preventing the scattering of fragments when the plate is damaged due to impact or the like.

The transparent adhesives may contain ultraviolet ray absorbing agent, whereby the electromagnetic-wave shielding and light transmitting plate has further improved ultraviolet ray resistance.

The display device of the present invention has the electromagnetic-wave shielding and light transmitting plate of the present invention.

DETAILED DESCRIPTION OF THE PREFERRED EMBODIMENTS

Hereinafter, preferred embodiments of an electromagnetic-wave shielding and light transmitting plate of the present invention will be described with reference to the attached drawings.

Figure 1:
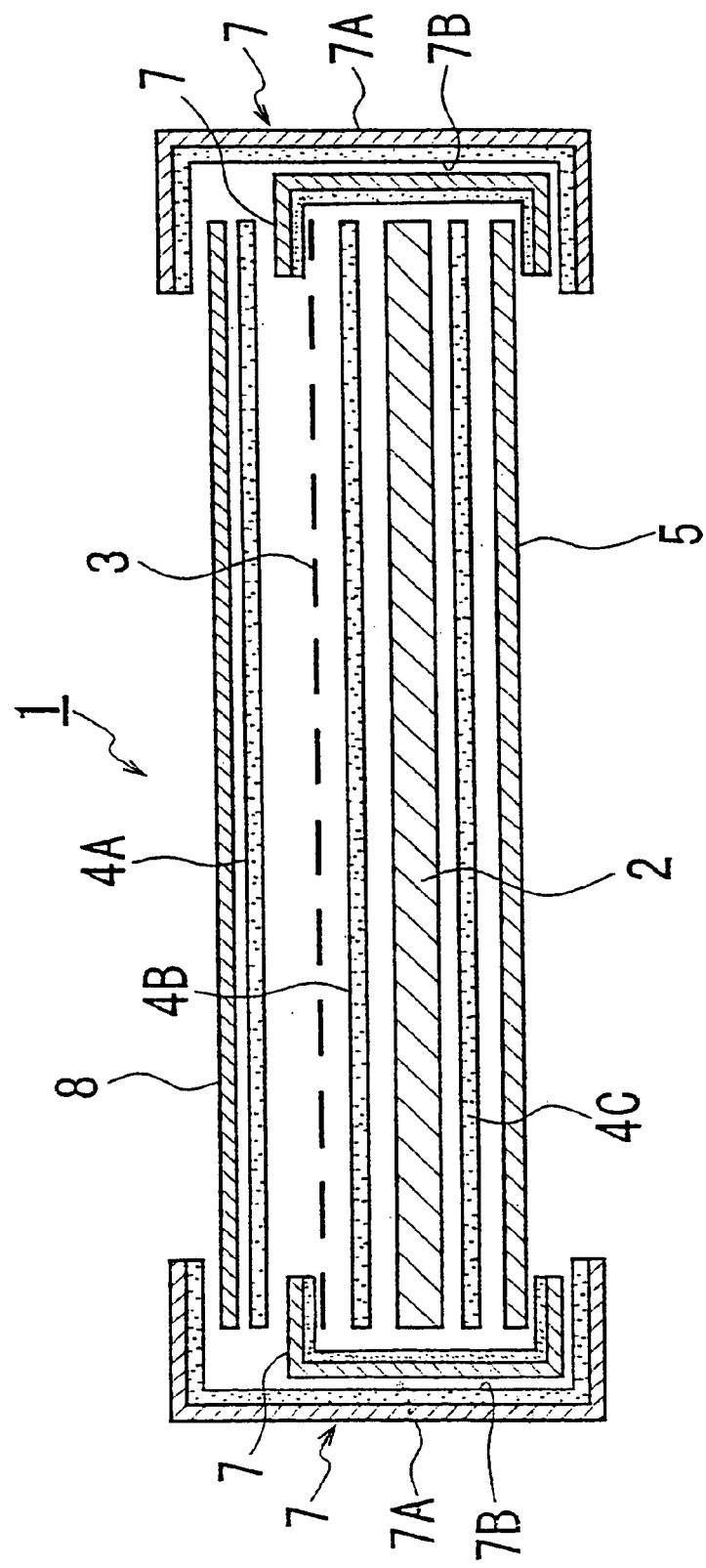
FIG. 1 is a schematic sectional view showing an embodiment of an electromagnetic-wave shielding and light transmitting plate of the present invention.

FIG. 1 is a schematic sectional view showing an embodiment of the electromagnetic-wave shielding and light transmitting plate of the present invention. FIGS. 2a through 2d are schematic sectional views showing embodiments of a near infrared ray blocking film according to the present invention.

The electromagnetic-wave shielding and light transmitting plate 1 shown in FIG. 1 has an antireflection film 8 as the front-most layer, an electroconductive mesh member 3, a transparent base plate 2, and a near infrared ray blocking film 5 as the rear-most layer, wherein they are laminated and integrated by adhesive intermediate films 4A, 4B and adhesive agent (adhesive film) 4C. A conductive adhesive tape 7 is bonded to cover the side periphery of the laminated assembly and margins along the edges of the front surface and the rear surface thereof.

The transparent base plate 2 may consist of glass, polyester, polyethylene terephthalate (PET), polybutylene terephthalate, polymethyl methacrylate (PMMA), acrylic resin, polycarbonate (PC), polystyrene, triacetate, polyvinyl alcohol, polyvinyl chloride, polyvinylidene chloride, polyethylene, ethylene-vinyl acetate copolymer, polyvinylbutyral, metal ionic cross-linked ethylene-methacrylic copolymer, polyurethane, and cellophane. Among these, glass, PET, PC, and PMMA are preferable.

The thickness of the transparent base plate 2 is preferably in a range from 0.1 to 10 mm, particularly 1 to 4 mm. However, the thickness may be suitably determined in accordance with requirements (e.g. strength, light weight) due to the application of the plate even with departing from this range.

Acrylic resin-based black painting may be provided in a flame shape on the peripheral portion of the transparent base plate 2. Heat ray antireflection coating such as metallic thin layer or transparent conductive layer may be provided to improve the function.

The antireflection film 8 may have a base film having a thickness of 25–250 μm such as PET, PC, and PMMA and a layer formed thereon. The layer may be a layer or layers consisting of a high-refractive transparent layer and a low-refractive transparent layer. An example of the layer is the following (1) and examples of the laminated layers are the following (2)–(5):

(1) a layer consisting of a lower-refractive transparent film than the transparent base plate;

(2) laminated layers consisting of a high-refractive transparent layer and a low-refractive transparent layer, i.e. two layers in total;

(3) laminated layers consisting of two high-refractive transparent layers and two low-refractive transparent layers which are alternately laminated, i.e. four layers in total;

(4) laminated layers consisting of a medium-refractive transparent layer, a high-refractive transparent layer, and a low-refractive transparent layer, i.e. three layers in total; and (5) laminated layers consisting of three high-refractive transparent layers and three low-refractive transparent layers which are alternately laminated, i.e. six layers in total.

The high-refractive transparent layer is preferably a transparent conductive layer, having a refractive index of 1.6 consisting of ZnO, $TiO_2$, $SnO_2$, or ZrO in which ITO (tin indium oxide), ZnO, or Al is doped. The high-refractive transparent layer may be made by dispersing particles of any aforementioned material into acrylic binder of polyester binder. The low-refractive transparent layer can be made of low-refractive material having a refractive index of 1.6 or less such as $SiO_2$, $MgF_2$, or $Al_2O_2$. The low-refractive transparent layer may consist of organic material such as silicone or fluorine. The thickness of each layer may be determined according to the film structure, the film kind, and the central wavelength because the refractive index in a visible-light area is reduced by interference of light. In case of four-layers structure, the antireflection film may have the first layer (high-refractive transparent layer) of 5 to 50 nm, the second layer (low-refractive transparent layer ) of 5 to 50 nm, the third layer (high-refractive transparent layer)of 50 to 100 nm, and the fourth layer (low-refractive transparent layer) of 50 to 150 nm in thickness.

The antireflection film 8 may further have an antifouling layer thereon to improve the fouling resistance of the surface. The antifouling layer is preferably a fluorocarbon or silicone layer having a thickness in a range from 1 to 1000 nm.

The near infrared ray blocking film 5 has a base film and a near infrared ray blocking layer on the surface of the base film. The near infrared ray blocking layer includes the diimmonium compound and the copper complex and/or the copper compound. This near infrared ray blocking layer may be formed by first preparing coating liquid in which the diimmonium compound and the copper complex and/or the copper compound are dispersed into base polymer and are diluted with suitable solvent to adjust the concentration, coating the prepared coating liquid on the surface of the transparent base film 1, and drying the coated layer.

In the present invention, the diimmonium compound to be used as near infrared ray absorbing agent can be represented by the following general formula (I) or (II):

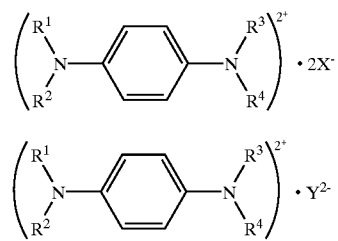

Each of $R_1$, $R_2$, $R_3$, and $R_4$ in the above formula (I), (II) is a hydrogen atom, a halogen atom, an alkyl group, an aryl group, or a functional group of aromatic series, $X^-$ is a monovalence anion, and $Y^{2-}$ is a bivalent anion.

$X^-$ may be a halogen ion such as $I^-$, $Cl^-$, $Br^-$, and $F^-$, inorganic ion such as $NO_3^-$, $BF_4^-$ $PF_6^-$, $ClO_4^-$, and $SbF_6^-$, organic carboxylic acid ion such as $CH_3COO^-$, $CF_3COO^-$, benzoic acid ion, and organic sulfonic acid ion such as $CH_3SO_3^-$, $CF_3SO_3^-$, benzene sulfonic acid ion, or naphthalene sulfonic acid ion. Preferably employed as the $Y^{2-}$ is an ion of an aromatic disulfonic acid having two sulfonic acid groups within its molecule, example of which includes an ion of naphthalenedisulfonic acid derivatives such as naphthalene-1,5-disulfonic acid, R acid, G acid, H acid, benzoyl H acid which has a benzoyl group bonded to an amino group of the H acid, p-chlorobenzoyl H acid, p-toluenesulfonyl H acid, chloro H acid which has a chlorine atom being replaced with an amino group of the H acid, chloroacetyl H acid, metanyl γ acid, 6-sulfonaphthyl-γ acid, C acid, ε acid, p-toluenesulfonyl R acid, naphthalene-1,6-disulfonic acid or 1-naphthol-4,8-disulfonic acid; carbonyl J acid, 4,4'-diaminostilbene-2,2'-disulfonic acid, di-J acid, naphthalic acid, naphthalene-2,3-dicarboxylic acid, diphenic acid, stilbene-4,4'-dicarboxylic acid, 6-sulfo-2-oxy-3-naphthoic acid, anthraquinone-1,8-disulfonic acid, 1,6-diaminoanthraquinone-2,7-disulfonic acid, 2-(4-sulfophenyl)-6-aminobenzotriazole-5-sulfonic acid, 6-(3-methyl-5-pyrazolonyl)-naphthalene-1,3-disulfonic acid, 1-naphthol-6-(4-amino-3-sulfo)anilino-3-sulfonic acid or the like. More preferable divalent organic anion is an ion of naphthalenedisulfonic acid. Further more preferable divalent organic anion is an ion represented by the following general formula (III):

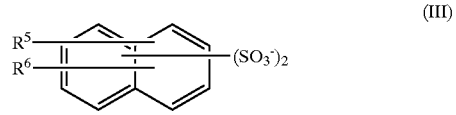

Each of $R^5$ and $R^6$ in the formula (III) is each a hydrogen atom, a halogen atom, a lower alkyl group, a hydroxyl group, an alkylamino group, an amino group, —$NHCOR^7$, —$NHSO_2R^7$, —$OSO_2R^7$ (where $R^7$ is substituted or unsubstituted aryl group or substituted or unsubstituted alkyl group), or an acetyl group.

A suitable example of the diimmonium compound is represented by the following general formula (IV):

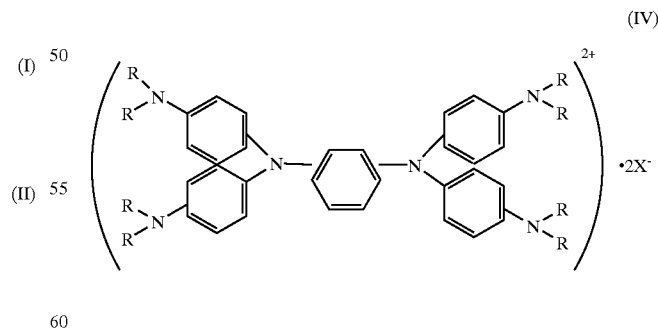

R in the formula (IV) is an alkyl group having 1 to 8 carbon atoms, preferably an n-butyl group, and $X^-$ is preferably $BF_4^-$, $PF_6^-$, $ClO_4^-$, or $SbF_6^-$.

A concrete example of the diimmonium compound is represented by the following formula (V):

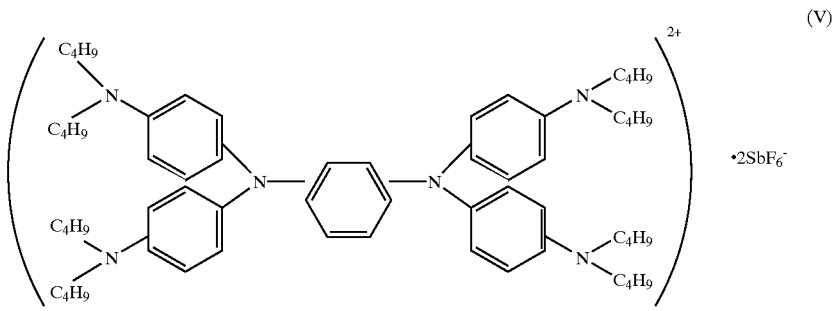

The copper complex having the aforementioned formula (A) may be 1,2-benzenethiol copper complex compound, including as a concrete example bis(4-t-butyl-1,2-dithiophenolate) copper-tetra-n-butylammonium which is represented by the following formula (VI) and 4-morpholinosulphonyl-1,2-benzendithiol copper complex which is represented by the following formula (VI).

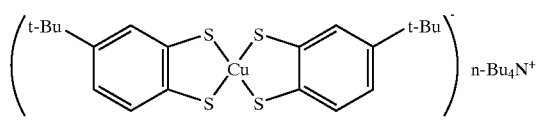

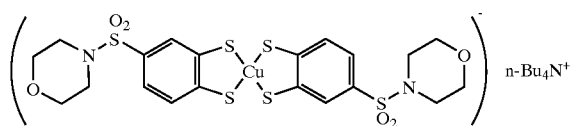

(Bu: butyl group)

The copper complex compound having the aforementioned formula (B) may be copper dimethyldithiocarbamate represented by the following formula (VIII):

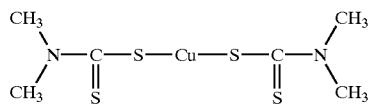

The diimmonium compound and the copper complex and/or the copper compound are commercially sold.

When the amount of the diimmonium compound contained in the near infrared ray blocking layer is too small, poor efficiency of blocking near infrared ray may be obtained. When the amount is too large, the transmittance for visible light may be low. Therefore, the amount of the diimmonium compound is preferably 0.001 to 100 parts by weight, more preferably 0.01 to 50 parts by weight, and most preferably 0.1 to 10 parts by weight relative to 100 parts by weight of base polymer.

When the amount of the copper complex and/or copper compound contained in the near infrared ray blocking layer is too small, intended improvement in the durability such as heat resistance and moisture resistance becomes insufficient. When the amount of the copper complex and/or copper compound is too large, the near infrared ray blocking layer is colored so that poor appearance of the near infrared ray blocking film may be obtained. Therefore, the amount of the copper complex and/or copper compound is preferably 0.01 to 100 parts by weight, more preferably 0.1 to 50 parts by weight, and most preferably 0.5 to 30 parts by weight relative to 100 parts by weight of the diimmonium compound.

The base polymer of the near infrared ray blocking layer may be polyester resin, acrylic resin, methacrylic resin, urethane resin, silicone resin, phenol resin, or a homopolymer or copolymer of (meth) acrylic acid ester. Among these, acrylic resin or polyester resin may be preferably used.

The base film is not limited, but may consist of polyester resin, acrylic resin, cellulose resin, polyethylene resin, polypropylene resin, polyolefine resin, polyvinyl chloride resin, polycarbonate resin, phenol resin, or urethane resin. Among these, polyester resin film may be preferably used from the viewpoints of transparency and weatherablility.

The thickness of the base film is preferably in a range between 10 μm and 1 mm to prevent the thickness of the resultant electromagnetic-wave shielding and light transmitting plate from being too thick to ensure its easy handling and its durability. The thickness of the near infrared ray blocking layer, which is formed on this base film, is usually from 0.5 to 50 μm from the viewpoints of near infrared ray blocking efficiency and transmittance for visible light.

The near infrared ray blocking film of the electromagnetic-wave shielding and light transmitting plate of the present invention preferably has the base film on which two or more of near infrared ray blocking layers are formed. More preferably, the layers are made of different near infrared ray absorbing agents. In this case, advantageously, the electromagnetic-wave shielding and light transmitting plate can obtain significantly improved near infrared ray blocking capability in a wide near infrared wave-length region.

Figure 2A:
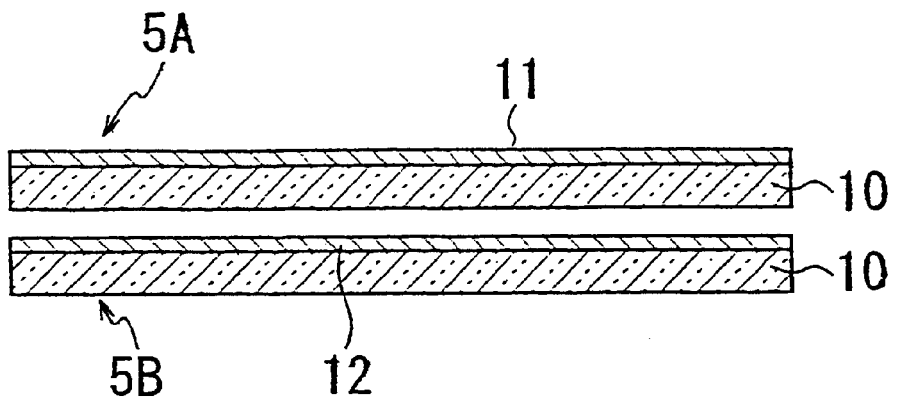
FIGS. 2a, 2b, 2c, and 2d are schematic sectional views showing embodiments of a near infrared ray cut film according to the present invention.
Figure 2B:
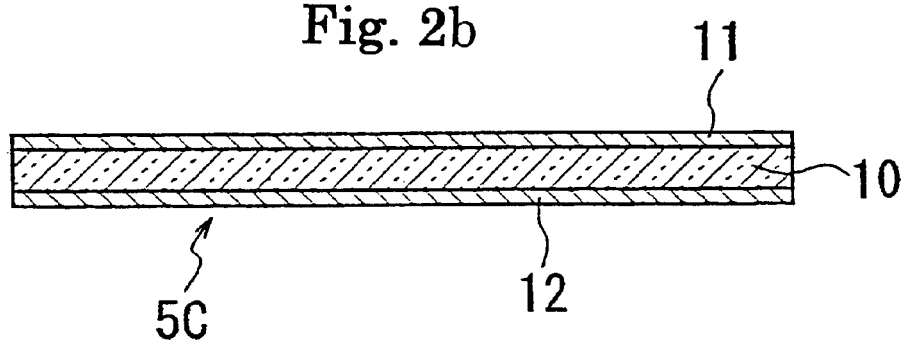
Figure 2C:
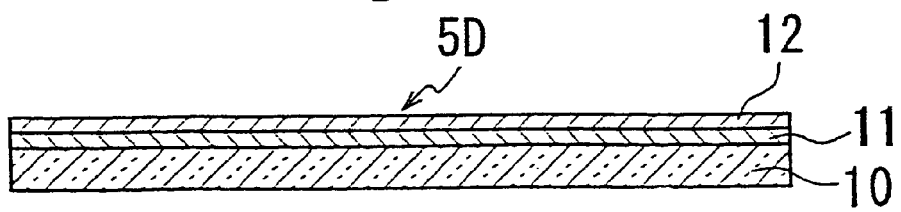
Figure 2D:
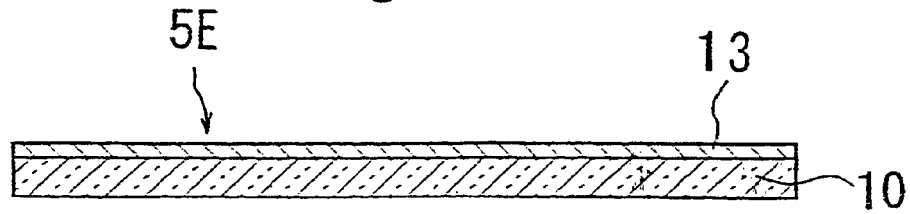

The near infrared ray blocking film may be one of followings:

i) as shown in FIG. 2a, a composition film consisting of a first near infrared ray blocking film 5A having a base film 10 on which a near infrared ray blocking layer 11 is formed, and a second near infrared ray blocking film 5B, having a base film 10 on which a near infrared ray blocking layer 12 is formed;

ii) as shown in FIG. 2b, a near infrared ray blocking film 5C having a base film 10, a near infrared ray blocking layer 11 formed on one surface of the base film 10, and a near infrared ray blocking layer 12 formed on the other surface of the base film 10;

iii) as shown in FIG. 2c, a near infrared ray blocking film 5D having a base film 10, a near infrared ray blocking layer 11 and a near infrared ray blocking layer 12 which are formed and laminated to each other on a surface of the base film 10;

iv) as shown in FIG. 2d, a near infrared ray blocking film 5E having a base film 10 and a near infrared ray blocking layer 13 formed on the base film 10; and v) a composite film consisting of any two or more of the above i) through iv).

In the aforementioned films i) through iii), it is preferable that one of the near infrared ray blocking layers 11, 12 contains the diimmonium compound and the copper complex and/or the copper compound while the other layer other than above consists of another composition.

In the aforementioned structure iv), it is preferable that the near infrared ray blocking layers 13 contains the diimmonium compound and the copper complex and/or the copper compound and, if necessary, further contains another near infrared ray absorbing agent.

Among the near infrared ray blocking films shown in FIG. 2a through FIG. 2d, the film shown in FIG. 2c or FIG. 2d is preferable because the film consists of a single film and the near infrared ray blocking layer is not exposed outside.

In order to give good transparency and good near infrared ray blocking capability (for example, absorbing sufficiently near infrared in a wide wave-length range of 850 to 1,250 nm), the above-referred "other layer" other than the layer containing the diimmonium compound and the copper complex and/or the copper compound may be one or more of the following layers (a) to (e):

(a) a coating layer made of ITO having a thickness from 100 Å to 5000 Å;

(b) a coating layer made of an alternative lamination of ITO and silver having a thickness from 100 Å to 10000 Å;

(c) a coating layer having a thickness from 0.5 to 50 microns and containing a nickel complex and immonium which is prepared with using a suitable transparent base polymer;

(d) a coating layer having a thickness from 10 to 10000 microns made by forming a film from a copper compound including bivalent copper ion with a suitable transparent base polymer; and (e) a coating layer having a thickness from 0.5 to 50 microns made of organic pigment.

The electromagnetic-wave shielding and light transmitting plate of the present invention may have further a transparent electroconductive film laminated on the near infrared ray blocking film. The transparent electroconductive film may be a resin film in which electroconductive particles are dispersed or a base film on which a transparent electroconductive layer is formed.

The electroconductive mesh member 3 interposed between the transparent base plate 2 and the antireflection film 8 is made of metallic fibers and/or metal-coated organic fibers. From viewpoints of improving the optical transparency and preventing the moiré phenomenon, the conductive mesh member 3 preferably has a wire diameter from 1 µm to 1 mm and an open area ratio from 40 to 95%. A wire diameter exceeding 1 mm of the conductive mesh member 3 may reduce the open area ratio or reduce the electromagnetic-wave shielding capability. The wire diameter not exceeding 1 µm may give insufficient strength to the mesh member, thus making the handling difficult. The open area ratio exceeding 95% is too high to maintain the mesh configuration, while the open area ratio not exceeding 40% is too low to get good light transmittance, thus making the light from the display poor. More preferable wire diameter is from 10 to 500 µm and more preferable open area ratio is from 50 to 90%.

It should be noted that the term "open area ratio of the conductive mesh member" means the ratio of open area to the projected area of the conductive mesh member.

Examples as metal of the metallic fibers or metal-coated organic fibers constituting the conductive mesh member 3 include copper, stainless steel, aluminum, nickel, titanium, tungsten, tin, lead, iron, silver, chromium, carbon, or alloy thereof. Preferably selected from the above are copper, nickel, stainless steel, and aluminum.

Examples as organic material of the metal-coated organic fibers include polyester, nylon, vinylidene chloride, aramid, vinylon, and cellulose.

According to the present invention, a conductive mesh member which is made by metal-coated organic fibers and which is excellent in maintaining the mesh configuration is preferably employed from the viewpoint of maintaining the open area ratio and the wire diameter.

As an electromagnetic-wave shielding member, a conductive mesh formed by etching or printing may be employed in place of the aforementioned conductive mesh member.

As electromagnetic-wave shielding member, a conductive mesh formed by etching or printing may be employed in place of the aforementioned conductive mesh member.

As the conductive mesh formed by etching, a metallic film formed in a lattice or punching metal-like arrangement by a method of photolithography can be employed. The metallic film may be a metallic layer of copper, aluminum, stainless steel, or chromium which is formed on a transparent base plate of PET, PC, or PMMA by vapor deposition or sputtering or a metallic foil of the aforementioned material which is bonded to the transparent base plate by adhesive agent. The adhesive agent is preferably selected from epoxy series, urethane series, or EVA series.

The metallic film is preferably previously printed with black on one side or both sides. By using a method of photolithography, the shape and diameter of conductive portions can be freely designed, thus having higher open area ratio than that of the aforementioned conductive mesh member.

As the conductive mesh formed by printing, binder such as epoxy series, urethane series, EVA series, melanin series, cellulose series, or acryl series which is mixed with metallic particles or non-metallic particles is applied into a pattern such as a lattice on a transparent base plate of PET, PC, or PMMA by a method of gravure printing, offset printing, and screen printing, wherein the metallic particles may be silver, copper, aluminum, or nickel and the non-metallic particles may be carbon.

As another example of electromagnetic-wave shielding member, a transparent conductive film which is coated by a transparent conductive layer may be employed.

The conductive particles to be dispersed in the film may be any particles having conductivity and the followings are examples of such conductive particles:

(i) carbon particles or powder;

(ii) particles or powder of metal such as nickel, indium, chromium, gold, vanadium, tin, cadmium, silver, platinum, aluminum, copper, titanium, cobalt, or lead, alloy thereof, or conductive oxide thereof, (iii) particles made of plastic such as polystyrene and polyethylene, which are surfaced with coating layer of a conductive material from the above (i) and (ii); and (iv) a body formed by alternatively laminating ITO and silver.

Because the conductive particles of too large particle diameter affect the light transparency and the thickness of the transparent conductive film, it is preferable that the particle diameter is 0.5 mm or less. The preferable particle diameter of the conductive particles is between 0.01 and 0.5 mm.

The high mixing ratio of the conductive particles in the transparent conductive film spoils the light transparency, while the low mixing ratio makes poor electromagnetic-wave shielding capability. The mixing ratio of the conductive particles is therefore preferably between 0.1 and 50% by weight, particularly between 0.1 and 20% by weight and more particularly between 0.5 and 20% by weight, relative to the resin of the transparent conductive film.

The color and the luster of the conductive particles can be suitably selected according to the application. In case of a filter for a display panel, conductive particles having a dark color such as black or brown and dull surfaces are preferable. In this case, the conductive particles can suitably adjust the light transmittance of the filter so as to make the display easy-to-see.

Such a transparent conductive layer on the base film may be made of tin indium oxide, zinc aluminum oxide, or the like by one of methods including vapor deposition, sputtering, ion plating, and CVD (chemical vapor deposition). In this case, when the thickness of the transparent conductive layer is less than 0.01 $\mu$m, sufficient electromagnetic-wave shielding efficiency can not be obtained, because the thickness of the conductive layer for the electromagnetic-wave shielding is too thin, and when exceeding 5 $\mu$m, light transparency may be spoiled.

Examples of matrix resin of the transparent conductive film and resin of the base film include polyester, PET, polybutylene terephthalate, PMMA, acrylic resin, PC, polystyrene, triacetate, polyvinyl alcohol, polyvinyl chloride, polyvinylidene chloride, polyethylene, ethylene-vinyl acetate copolymer, polyvinylbutyral, metal ionic cross-linked ethylene-methacrylic copolymer, polyurethane, and cellophane. Preferably selected from the above resins are PET, PC, and PMMA.

The thickness of the transparent conductive film is preferably in a range from 1 $\mu$m to 5 mm.

The conductive mesh member 3 may be formed to have an area larger than that of the transparent base plate 2 so that the periphery thereof is positioned outside of peripheral edges of the transparent base plate 2 and the periphery thus can be folded along the peripheral edges of the transparent base plate 2.

Preferably used as adhesive resin forming adhesive intermediate layers 4A, 4B for bonding the antireflection film 8, the conductive mesh member 3, and the transparent base plate 2 is transparent and elastic adhesive resin as used for laminated glass. Particularly, as the adhesive intermediate layers 4A, 4B positioned ahead of the transparent base plate 2, the elastic resin preferably having high elasticity and thus having high capability of preventing the scattering of fragments is effectively used.

Examples of adhesive resins having such high elasticity include copolymers of ethylene group, such as ethylene-vinyl acetate copolymer, ethylene-methyl acrylate copolymer, ethylene-(meth)acrylic copolymer, ethylene-ethyl (meth)acrylate copolymer, ethylene-methyl (meth) 'acrylate copolymer, metal ionic cross-linked ethylene-(meth)acrylic copolymer, partial saponified ethylene-vinyl acetate copolymer, carboxylated ethylene-vinyl acetate copolymer, ethylene-(meth)acrylic-maleic anhydride copolymer, and ethylene-vinyl acetate-(meth)acrylate copolymer. It should be noted that "(meth)acrylic" means "acrylic or methacrylic". Besides the above resins, polyvinyl butyral (PVB) resin, epoxy resin, acrylic resin, phenol resin, silicone resin, polyester resin, or urethane resin may also be employed. Ethylene-vinyl acetate copolymer (EVA) is easy to be handled and preferable. In terms of the impact resistance, the perforation resistance, the adhesive property, and the transparency, PVB resin often used for laminated safety glasses for automobile is also preferable.

The thickness of the adhesive intermediate layers 4A, 4B is preferably in a range between 10 and 1000 $\mu$m. The near infrared ray blocking film 5 is preferably laminated on the transparent base plate 2 with the adhesive agent 4C because the near infrared ray blocking film 5 is sensitive to heat so as not to withstand heat at temperature for crosslinking (130–150 ° C.). Low-temperature crosslinkable EVA (the temperature for crosslinking: 70–130 ° C.) may be used for bonding the near infrared ray blocking film 5 to the transparent base plate 2.

The adhesive intermediate films 4A, 4B and the adhesive agent 4C may further include, in small amounts, ultraviolet ray absorbing agent, infrared ray absorbing agent, antioxidant, and/or paint processing aid. For adjusting the color of the filter itself, they may further include coloring agent such as dye and pigment, and/or filler such as carbon black, hydrophobic silica, and calcium carbonate.

It is also effective that the intermediate adhesive layers in sheet condition are surfaced by corona discharge process, low temperature plasma process, electron beam irradiation process, or ultraviolet irradiation process as measures of improving the adhesive property.

The intermediate adhesive layers can be manufactured for example, by first mixing the adhesive resin and the additives listed above, kneading them by an extruder or a roll, and after that, forming in a predetermined configuration by means of a film forming method such as calendering, rolling, T-die extrusion, or inflation. During the film formation, embossing is provided for preventing the blocking between sheets and facilitating the deaerating during pressurization onto the transparent base plate.

Instead of the EVA resin, PVB resin can be suitably used as mentioned above. It is preferable that the PVB resin contains polyvinyl acetal between 70 and 95% by weight and polyvinyl acetate between 1 and 15% by weight, and has an average degree of polymerization between 200 and 3000, preferably 300 and 2500. The PVB resin is used as resin composition containing plasticizer.

As another transparent adhesive agent, a sticking self-adhesive agent (pressure sensitive adhesive), for example, acrylic adhesives and thermoplastic elastomer type adhesives such as SBS and SEBS may be also suitably employed. Such self-adhesive may further suitably include a tackifier, ultraviolet ray absorbing agent, coloring pigment, coloring dye, antioxidant, and/or sticking aid. The sticking agent may be previously applied to a surface of the antireflection film or the near infrared ray blocking film to form a coating of a thickness of 5 to 100 microns or a layer of the sticking agent having such a thickness is previously laminated to the surface. Then, the antireflection film or the near infrared ray blocking film with the sticking agent is laminated to the transparent base plate or the other film (because EVA is sensitive to heat).

The conductive adhesive tapes 7 are used in a double-ply manner. The outside tape 7 is bonded all around the side periphery of the laminated assembly composed of the transparent base plate 2, the conductive mesh member 3, and the near infrared ray blocking film 5 and is bonded to margins along the edges of the front surface and the rear surface thereof, thus being bonded to both the edges of the antireflection film 8 and the edges of the near infrared ray blocking film 5. The inside tape 7 is bonded to the edges of the conductive mesh member 3, the edges of the near infrared ray blocking film 5, and the side periphery of a laminated assembly formed therebetween.

Each conductive adhesive tape 7 is formed, for example, by laying an adhesive layer 7B in which conductive particles are dispersed on one surface of a metallic foil 7A as shown in FIG. 1. Used as the adhesive layer 7B may be acrylic adhesive, rubber adhesive, silicone adhesive, or epoxy or phenolic resin containing hardener.

Conductive materials of any type having good electrical continuities may be employed as the conductive particles to be dispersed in the adhesive layer 7B. Examples include metallic powder of, for example, copper, silver, and nickel, or ceramic powder coated with such a metal as mentioned above. There is no specific limitation on its configuration so that the particles may have any configuration such as flake-like, dendritic, granular, or pellet-like configuration.

The content of the conductive particles is preferably 0.1–15% by volume relative to the polymer composing the adhesive layer 7B and the average particle size is preferably 0.1–100 $\mu$m. Such limitation on the content and the particle size prevents the condensation of the conductive particles so as to obtain good electroconductivity.

The metallic foil 7A as a base of the conductive adhesive tape 7 may be made of metal such as copper, silver, nickel, aluminum, or stainless steel and normally has a thickness of 1 to 100 $\mu$m.

The adhesive layer 7B is made of a mixture in which the aforementioned self-adhesive and conductive particles are mixed uniformly in a predetermined ratio, and can be easily formed by applying the mixture onto the metallic foil 7A using a roll coater, a die coater, a knife coater, a bar coater, a flow coater, a spray coater or the like.

The thickness of the adhesive layer 7B is normally in a range from 5 to 100 $\mu$m.

To manufacture the electromagnetic-wave shielding and light transmitting plate 1 as shown in FIG. 1, the antireflection film 8, the conductive mesh member 3, the transparent base plate 2, the near infrared ray blocking film 5, the adhesive intermediate layers 4A, 4B, the adhesive agent 4C, and the conductive adhesive tape 7 are first prepared. The antireflection film 8, the conductive mesh member 3, and the transparent base plate 2 are laminated with the adhesive intermediate layers 4A, 4B interposed therebetween, respectively and compressed under the hardened condition of the adhesive intermediate films 4A, 4B, and then heated or irradiated to integrate them. After that, the near infrared ray blocking film 5 is laminated to the integrated body by the adhesive agent 4C. If necessary, margins of the conductive mesh member 3 extending out of the integrated body are folded and, after that, the conductive adhesive tape 7 is stuck around the assembled unit to fix the folded margins onto the surface and cured according to a curing method, such as heat pressurized bonding, suitable for the employed conductive adhesive tape 7.

Instead of a part or the entire of the adhesive intermediate layers 4A, 4B, a sticking self-adhesive agent may be used.

When a cross-linkable conductive adhesive tape is used as the conductive adhesive tape 7, the cross-linkable conductive adhesive tape is bonded to the integrated body by tackiness of the adhesive layer 7B thereof (this temporal adhesion allows re-adhesion, if necessary) and then heated or radiated with ultraviolet under pressure, if necessary. In case of ultraviolet radiation, heating may be also performed. The cross-linkable conductive tape may be partially bonded by partially heating or radiating ultraviolet.

The heat bonding can be easily conducted by a normal heat sealer. As one of compressing and heating methods, a method may be employed that the integrated body applied with the cross-linkable conductive adhesion tape is inserted into a vacuum bag which is then vacuumed and after that is heated. Therefore, the bonding operation is quite easy.

The bonding condition in case of thermal cross-linking depends on the type of crosslinking agent (organic peroxide) to be employed. The cross-linking is conducted normally at a temperature from 70 to 150° C., preferably from 70 to 130° C. and normally for 10 seconds to 120 minutes, preferably 20 seconds to 60 minutes.

In case of photo crosslinking, various light sources emitting linght in ultraviolet to visible range may be employed. Examples include an extra-high pressure, high pressure, or low pressure mercury lamp, a chemical lamp, a xenon lamp, a halogen lamp, a Mercury halogen lamp, a carbon arc lamp, an incandescent lamp, and a laser radiation. The period of radiation is not limited because it depends on the type of lamp and the strength of the light source, but normally in a range from dozens of seconds to dozens of minutes. In order to aid the cross-linking, ultraviolet may be radiated after previously heating to 40–120° C.

The pressure for bonding should be suitably selected and is preferably 5–50 kg/cm$^2$, particularly 10–30 kg/cm$^2$.

The electromagnetic-wave shielding and light transmitting plate 1 with the conductive adhesive tapes 7 mentioned above can be quite easily built in a body of an equipment only by fitting into the body. When the margins of the conductive mesh member 3 extending from the body are folded, the plate 1 can provide uniform and good electrical conductivity between the conductive mesh member 3 and the body of the equipment through the conductive adhesive tapes 7 on four sides of the plate 1, thereby exhibiting high electromagnetic-wave shielding efficiency. In addition, excellent near infrared ray blocking capability can be obtained because of the existence of the near infrared ray blocking film 5. Further, since only one transparent base plate 2 is used, the plate is thin and light.

Since both the surfaces of the transparent base plate are covered by the films 8, 5, respectively, the electromagnetic-wave shielding and light transmitting plate has an effect of preventing the transparent base plate from being broken and an effect of preventing the transparent base plate from scattering even if broken.

Since the near infrared ray blocking layer of the near infrared ray blocking film 5 is excellent in resistance to heat, moisture, and ultraviolet ray due to including the near infrared absorbing agent and the antioxidant, the durability of the electromagnetic-wave shielding and light transmitting plate can also be improved.

It should be noted that the electromagnetic-wave shielding and light transmitting plate shown in FIG. 1 is an example of the electromagnetic-wave shielding and light transmitting plates of the present invention, so the present invention is not limited to the illustrative example. For example, a transparent conductive film may be employed with the near infrared ray blocking film. A transparent conductive layer may be directly formed on the surface of the transparent base plate 2.

The electromagnetic-wave shielding and light transmitting plate of the present invention is quite suitable for a front filter of PDP and a window of a place where a precision apparatus is installed, such as a hospital or a laboratory.

Hereinafter, the present invention will be described in more detail with reference to examples and comparative examples.

EXAMPLES 1–8

Comparative Examples 1, 2

Materials for forming the near infrared ray blocking layer specified in Table 1 were dissolved into a mixed solvent composed of dichloromethane: 18.5 g, tetrahydrofuran: 37 g, and toluene: 37 g so as to prepare coating liquid, and this coating liquid was applied on a polyethylene film having a width of 200 mm and a thickness of 100 $\mu$m and dried at a room temperature so as to form a near infrared ray blocking layer having a thickness of 5 $\mu$m. In this manner, each near infrared ray blocking film was prepared.

Each near infrared ray blocking film thus prepared was kept at 80 ° C. for 500 hours. The absorbance before and after the experience was measured and the residual ratio of absorbance at 1090 nm was calculated from the following equation:

Absorbance residual ratio at 1090 nm=Absorbance at 1090 nm after subjected to 80 ° C. for 500 hours/Initial absorbance at 1090 nm Results are shown in Table 1.

TABLE 1

|  |  | Example | | | | | | | | Comparative Example | |
|---|---|---|---|---|---|---|---|---|---|---|---|
|  |  | 1 | 2 | 3 | 4 | 5 | 6 | 7 | 8 | 1 | 2 |
| Materials for near infrared ray blocking layer (g) | Base Polymer *1 | 7.5 | 7.5 | 7.5 | 7.5 | 7.5 | 7.5 | 7.5 | 7.5 | 7.5 | 7.5 |
|  | Diimmonium Compound A *2 | 0.25 | 0.25 | 0.22 | 0.3 | 0.35 | — | — | — | 0.28 | 0.32 |
|  | Diimmonium Compound B *3 | — | — | — | — | — | 0.25 | — | — | — | — |
|  | Diimmonium Compound C *4 | — | — | — | — | — | — | 0.25 | — | — | — |
|  | Diimmonium Compound D *5 | — | — | — | — | — | — | — | 0.25 | — | — |
|  | Copper dithiolene complex A *6 | 0.025 | — | — | — | — | — | — | — | — | — |
|  | Copper dithiolene complex B *7 | — | 0.025 | 0.006 | 0.1 | 0.035 | 0.025 | 0.025 | 0.025 | — | — |
|  | Ni dithiolene compound *8 | — | — | — | — | 0.28 | — | — | — | — | 0.28 |
| Absorbance residual ratio at 1090 nm | | 0.94 | 0.94 | 0.92 | 0.92 | 0.84 | 0.90 | 0.91 | 0.92 | 0.78 | 0.71 |

*1: Polyester resin "Delpet 80 N" manufactured by Asahi Chemical industry Co., Ltd.
*2: "CIR-1081" manufactured by Japan Carlit Co., Ltd. Compound Name: hexafluoroantimonate of N,N,N',N'-tetrakis(p-dibutylaminophenyl)-p-phenylenediimmonium
*3: "CIR-1080" manufactured by Japan Carlit Co., Ltd. Compound Name: perchlorate of N,N,N',N'-tetrakis(p-dibutylaminophenyl)-p-phenylenediimmonium
*4: "CIR-1083" manufactured by Japan Carlit Co., Ltd. Compound Name: tetrafluorophosphate of N,N,N',N'-tetrakis(p-dibutylaminophenyl)-p-phenylenediimmonium
*5: "IRG-022" manufactured by Nippon Kayaku Co., Ltd. Compound Name: hexafluoroantimonate of N,N,N',N'-tetrakis(p-dibutylaminophenyl)-p-phenylenediimmonium
*6: "BBT" manufactured by Sumitomo Seika Chemicals Co., Ltd. Compound Name: bis(4-t-butyl-1,2-dithiophenolate)copper-tetra-n- butylammonium
*7: "EST" manufactured by Sumitomo Seika Chemicals Co., Ltd. Compound Name: 4-morpholinosulfonyl-1,2-benzenedithiol copper complex
*8: "MIR-101" manufactured by Midori Kagaku Co., Ltd. Compound Name: bisdithiobenzyl nickel As apparent from Table 1, all of near infrared ray blocking films which have the near infrared ray blocking layer containing diimmonium compound or copper dithiolene complex exhibit good results that the absorbance residual ratio at 1090 nm after subjected to 85° C. for 500 hours was higher than 0.8. It is found that the film of the present invention has excellent heat resistance.

INDUSTRIAL APPLICABILITY

As described in detail, the present invention can provide an electromagnetic-wave shielding and light transmitting plate which is thin and light, is hard to be broken, and is hard to scatter even if broken. Further, the electromagnetic-wave shielding and light transmitting plate has significantly improved electromagnetic-wave shielding function and near infrared ray blocking function so that it can be suitably used as an electromagnetic-wave shielding filter of a PDP, and has high transparency so that distinct pictures are displayed.

Furthermore, the electromagnetic-wave shielding and light transmitting plate has durability of near infrared ray blocking function, that is, it is excellent in resistance to heat, moisture, and ultraviolet ray. The present invention can also provide a display panel such as a PDP employing the aforementioned electromagnetic-wave shielding and light transmitting plate.

What is claimed is:

1. An electromagnetic-wave shielding and light transmitting plate comprising: a transparent base plate, an electromagnetic-wave shielding member, an antireflection film as a front-most layer, and a near infrared ray blocking film which are laminated and integrated, wherein said near infrared ray blocking film comprises a base film and a near infrared ray blocking layer on a surface of the base film, and said near infrared ray blocking layer contains a near infrared ray absorbing agent composed of diimmonium compound and at least one material selected from the group consisting of a 1,2-benzenethiol copper complex compound and copper dimethyldithiocarbamate.

2. An electromagnetic-wave shielding and light transmitting plate according to claim 1, wherein said near infrared ray blocking layer is made of a base polymer in which the diimmonium compound and the at least one material selected from the group consisting of the 1,2-benzenethiol copper complex compound and copper dimethyldithiocarbamate are dispersed.

3. An electromagnetic-wave shielding and light transmitting plate according to claim 2, wherein the amount of the diimmonium compound in the near infrared ray blocking layer is 0.001 to 100 parts by weight relative to 100 parts by weight of base polymer.

4. An electromagnetic-wave shielding and light transmitting plate according to claim 2, wherein the base polymer is acrylic resin or polyester resin.

5. An electromagnetic-wave shielding and light transmitting plate according to claim 1, wherein the amount of the copper complex and/or the copper compound in the near infrared ray blocking layer is 0.01 to 100 parts by weight relative to 100 parts by weight of the diimmonium compound.

6. An electromagnetic-wave shielding and light transmitting plate according to claim 1, wherein the base film is a polyester film.

7. An electromagnetic-wave shielding and light transmitting plate according to claim 1, wherein said near infrared ray blocking film is disposed at a rear-most side of said plate.

8. An electromagnetic-wave shielding and light transmitting plate according to claim 1, wherein said electromagnetic-wave shielding member is at least one member selected from the group consisting of a mesh member made of metallic fibers and metal-coated organic fibers.

9. An electromagnetic-wave shielding and light transmitting plate according to claim 1, wherein said electromagnetic-wave shielding member is interposed between said transparent base plate and said antireflection film.

10. An electromagnetic-wave shielding and light transmitting plate according to claim 1, wherein lamination and integration are achieved by using transparent adhesives.

11. An electromagnetic-wave shielding and light transmitting plate according to claim 10, wherein the transparent adhesives at least at the front side of the transparent base plate are transparent elastic adhesives.

12. An electromagnetic-wave shielding and light transmitting plate according to claim 10, wherein said transparent adhesives contain ultraviolet ray absorbing agent.

13. A display device comprising an electromagnetic-wave shielding and light transmitting plate according to claim 1 as a front filter of a display thereof.

* * * * *